(12) United States Patent
Lee et al.

(10) Patent No.: US 10,736,215 B1
(45) Date of Patent: Aug. 4, 2020

(54) MULTILAYER CIRCUIT BOARD STRUCTURE AND MANUFACTURING METHOD THEREOF

(71) Applicant: Unimicron Technology Corp., Taoyuan (TW)

(72) Inventors: Shao-Chien Lee, Taipei (TW);
Ming-Hao Wu, Taoyuan (TW);
Zong-Hua Li, Taoyuan (TW)

(73) Assignee: Unimicron Technology Corp., Taoyuan (TW)

(*) Notice: Subject to any disclaimer, the term of this patent is extended or adjusted under 35 U.S.C. 154(b) by 0 days.

(21) Appl. No.: 16/421,467

(22) Filed: May 23, 2019

(30) Foreign Application Priority Data

Apr. 22, 2019 (TW) .............................. 108114002 A

(51) Int. Cl.
*H05K 1/02* (2006.01)
*H05K 3/32* (2006.01)
*H05K 3/46* (2006.01)
*H05K 3/24* (2006.01)

(52) U.S. Cl.
CPC ......... *H05K 1/0298* (2013.01); *H05K 1/0262* (2013.01); *H05K 1/0263* (2013.01); *H05K 3/243* (2013.01); *H05K 3/328* (2013.01); *H05K 3/46* (2013.01)

(58) Field of Classification Search
CPC .... H05K 1/0262; H05K 1/0263; H05K 3/243; H05K 3/328
USPC ................................................. 361/792–795
See application file for complete search history.

(56) References Cited

U.S. PATENT DOCUMENTS

2019/0013272 A1* 1/2019 Nam .................... H01L 23/5386

FOREIGN PATENT DOCUMENTS

| CN | 105826228 | 8/2016 |
|---|---|---|
| CN | 106102324 | 11/2016 |
| TW | 508012 | 10/2002 |
| TW | 201247433 | 12/2012 |
| TW | I614864 | 2/2018 |
| TW | I635782 | 9/2018 |

OTHER PUBLICATIONS

"Office Action of Taiwan Counterpart Application", dated Feb. 21, 2020, p. 1-p. 13.

* cited by examiner

*Primary Examiner* — Jeremy C Norris
(74) *Attorney, Agent, or Firm* — JCIPRNET

(57) ABSTRACT

A multilayer circuit board structure includes a first multilayer circuit board and a second multilayer circuit board. The first multilayer circuit board includes a first patterned circuit layer and a first dummy circuit layer. The first dummy circuit layer surrounds the first patterned circuit layer. The second multilayer circuit board is disposed on the first multilayer circuit board, and includes a second patterned circuit layer and a second dummy circuit layer surrounding the second patterned circuit layer. The first patterned circuit layer is bonded to the second patterned circuit layer and the first dummy circuit layer is bonded to the second dummy circuit layer. A hollow space is defined between the first multilayer circuit board and the second multilayer circuit board.

14 Claims, 6 Drawing Sheets

MULTILAYER CIRCUIT BOARD STRUCTURE AND MANUFACTURING METHOD THEREOF

CROSS-REFERENCE TO RELATED APPLICATION

This application claims the priority benefit of Taiwan application serial no. 108114002, filed on Apr. 22, 2019. The entirety of the above-mentioned patent application is hereby incorporated by reference herein and made a part of this specification.

BACKGROUND OF THE INVENTION

1. Field of the Invention

The invention relates to a circuit board structure and a manufacturing method thereof, and more particularly, to a multilayer circuit board structure and a manufacturing method thereof.

2. Description of Related Art

A Cu-to-Cu bonding technology currently used in the circuit boards refers to a process of coating a macromolecular dielectric layer fully on bonding surfaces of two circuit boards before bonding the two circuit boards. Next, a pose cure is performed on the macromolecular dielectric layer so that the macromolecular dielectric layer is fully filled in gaps between Cu-to-Cu bonding surfaces. In this way, a hybrid bonding may then be achieved by a metal-to-metal bonding (i.e., the Cu-to-Cu bonding) and a dielectric layer-to-dielectric layer bonding.

However, in the above method, the macromolecular dielectric layer is fully coated on the bonding surfaces, and bonding Cu surfaces are exposed by removing unnecessary macromolecular dielectric layer by ways of grinding or cutting. At the time, since the macromolecular dielectric layer is not completely cured yet, the step of removing the unnecessary macromolecular dielectric layer by ways of grinding or cutting may leads to an adhesion of the macromolecular dielectric layer which not only reduces the life of the machine but also affects the yield rate.

SUMMARY OF THE INVENTION

The invention provides a multilayer circuit board structure that can achieve the hybrid bonding and provide more preferable yield rate and product design freedom.

The invention also provides a manufacturing method of multilayer circuit board structure for manufacturing aforesaid multilayer circuit board structure.

The invention provides a multilayer circuit board structure which includes a first multilayer circuit board and a second multilayer circuit board. The first multilayer circuit board includes a first patterned circuit layer and a first dummy circuit layer. The first dummy circuit layer surrounds the first patterned circuit layer. The second multilayer circuit board is disposed on the first multilayer circuit board, and includes a second patterned circuit layer and a second dummy circuit layer surrounding the second patterned circuit layer. The first patterned circuit layer is bonded to the second patterned circuit layer and the first dummy circuit layer is bonded to the second dummy circuit layer. A hollow space is defined between the first multilayer circuit board and the second multilayer circuit board.

In an embodiment of the invention, each of the first dummy circuit layer and the second dummy circuit layer is a continuous ring dummy circuit layer.

In an embodiment of the invention, the hollow space is a vacuum space.

In an embodiment of the invention, the multilayer circuit board structure further includes a dielectric material. One of the first multilayer circuit board and the second multilayer circuit board has two through holes, and the through holes communicate through the hollow space. The dielectric material is filled in the through holes and the hollow space.

In an embodiment of the invention, each of the first dummy circuit layer and the second dummy circuit layer is a discontinuous ring dummy circuit layer, and the hollow space is an air space.

In an embodiment of the invention, the multilayer circuit board structure further includes a first surface treatment layer and a second surface treatment layer. The first patterned circuit layer includes a plurality of first pads. The first dummy circuit layer includes a plurality of first dummy pads. The first surface treatment layer is disposed around the first pads and around the first dummy pads. The first surface treatment layer exposes a first contact surface of each of the first pads and a first dummy contact surface of each of the first dummy pads. The second patterned circuit layer includes a plurality of second pads. The second dummy circuit layer includes a plurality of second dummy pads. The second surface treatment layer is disposed around the second pads and around the second dummy pads. The second surface treatment layer exposes a second contact surface of each of the second pads and a second dummy contact surface of each of the second dummy pads. The first contact surface of each of the first pads is bonded to the corresponding second contact surface of each of the second pads. The first dummy contact surface of each of the first dummy pads is bonded to the corresponding second dummy contact surface of each of the second dummy pads. The first surface treatment layer is bonded to the second surface treatment layer.

In an embodiment of the invention, one of the first dummy circuit layer and the second dummy circuit layer is a continuous ring dummy circuit layer. Another one of the first dummy circuit layer and the second dummy circuit layer is a discontinuous ring dummy circuit layer, and the hollow space is an air space.

The invention further provides a manufacturing method of multilayer circuit board structure, which includes the following steps. A first multilayer circuit board and a second multilayer circuit board are provided. The first multilayer circuit board includes a first patterned circuit layer and a first dummy circuit layer surrounding the first patterned circuit layer. The second multilayer circuit board includes a second patterned circuit layer and a second dummy circuit layer surrounding the second patterned circuit layer. A thermal compression process is performed to bond the first patterned circuit layer to the second patterned circuit layer and bond the first dummy circuit layer to the second dummy circuit layer. A hollow space is defined between the first multilayer circuit board and the second multilayer circuit board.

In an embodiment of the invention, each of the first dummy circuit layer and the second dummy circuit layer is a continuous ring dummy circuit layer.

In an embodiment of the invention, the thermal compression process is performed in a vacuum environment, and the hollow space is a vacuum space.

In an embodiment of the invention, the manufacturing method of multilayer circuit board structure further includes providing a dielectric material after the thermal compression process is performed. One of the first multilayer circuit board and the second multilayer circuit board has two through holes, and the through holes communicate through the hollow space. The dielectric material is filled in the through holes and the hollow space.

In an embodiment of the invention, each of the first dummy circuit layer and the second dummy circuit layer is a discontinuous ring dummy circuit layer, and the hollow space is an air space.

In an embodiment of the invention, the manufacturing method of multilayer circuit board structure further includes forming a first surface treatment layer before the thermal compression process is performed. The first patterned circuit layer includes a plurality of first pads, and the first dummy circuit layer includes a plurality of first dummy pads. The first surface treatment layer is disposed around the first pads and around the first dummy pads. The first surface treatment layer exposes a first contact surface of each of the first pads and a first dummy contact surface of each of the first dummy pads. A second surface treatment layer is formed. The second patterned circuit layer includes a plurality of second pads, and the second dummy circuit layer includes a plurality of second dummy pads. The second surface treatment layer is disposed around the second pads and around the second dummy pads. The second surface treatment layer exposes a second contact surface of each of the second pads and a second dummy contact surface of each of the second dummy pads. During the thermal compression process, the first contact surface of each of the first pads is bonded to the corresponding second contact surface of each of the second pads. The first dummy contact surface of each of the first dummy pads is bonded to the corresponding second dummy contact surface of each of the second dummy pads. The first surface treatment layer is bonded to the second surface treatment layer.

In an embodiment of the invention, one of the first dummy circuit layer and the second dummy circuit layer is a continuous ring dummy circuit layer. Another one of the first dummy circuit layer and the second dummy circuit layer is a discontinuous ring dummy circuit layer. The hollow space is an air space.

Based on the above, in the design of the multilayer circuit board structure of the invention, with the hollow space defined between the first multilayer circuit board and the second multilayer circuit board bonded to each other, in addition to achieving the hybrid bonding, the dielectric constant of the hollow space may also be selected according to product requirements to provide more preferable yield rate and product design freedom.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
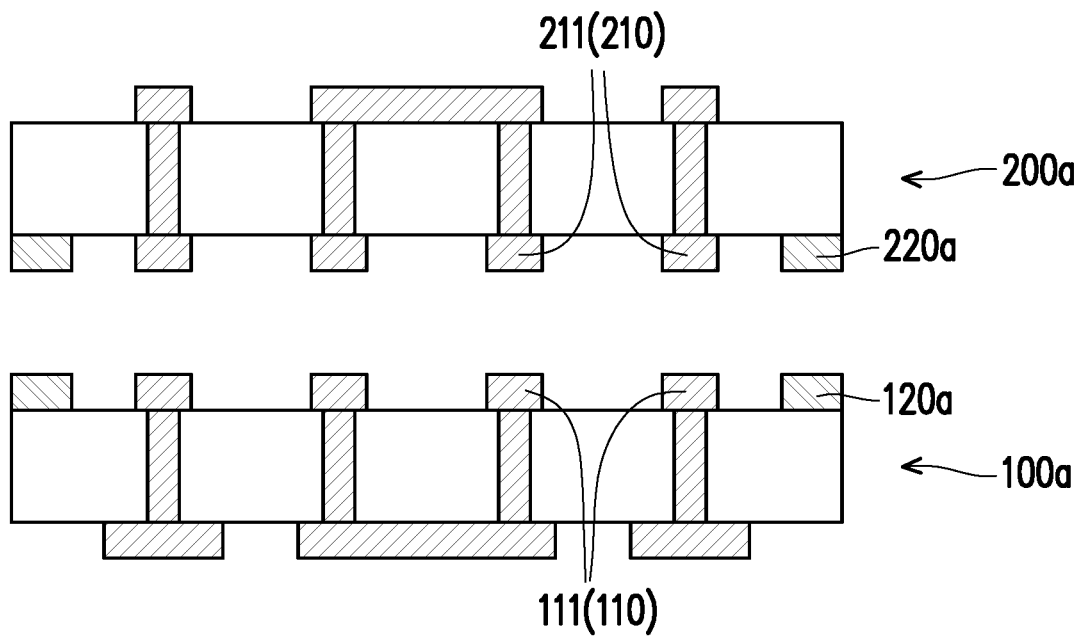
FIG. 1A and FIG. 1B are cross sectional views for illustrating a manufacturing method of multilayer circuit board structure according to an embodiment of the invention.

Exemplary embodiments of the invention are described comprehensively with reference to the accompanied drawings. Nonetheless, then invention can still be implemented in a number of different forms, and should not be construed as limited by the embodiments set forth in the disclosure. In the drawings, for clarity, size and thickness of each of regions, parts and layers may not be drawn according to actual proportion. For ease of explanation, the same devices below are provided with the same reference numerals.

Figure 1B:
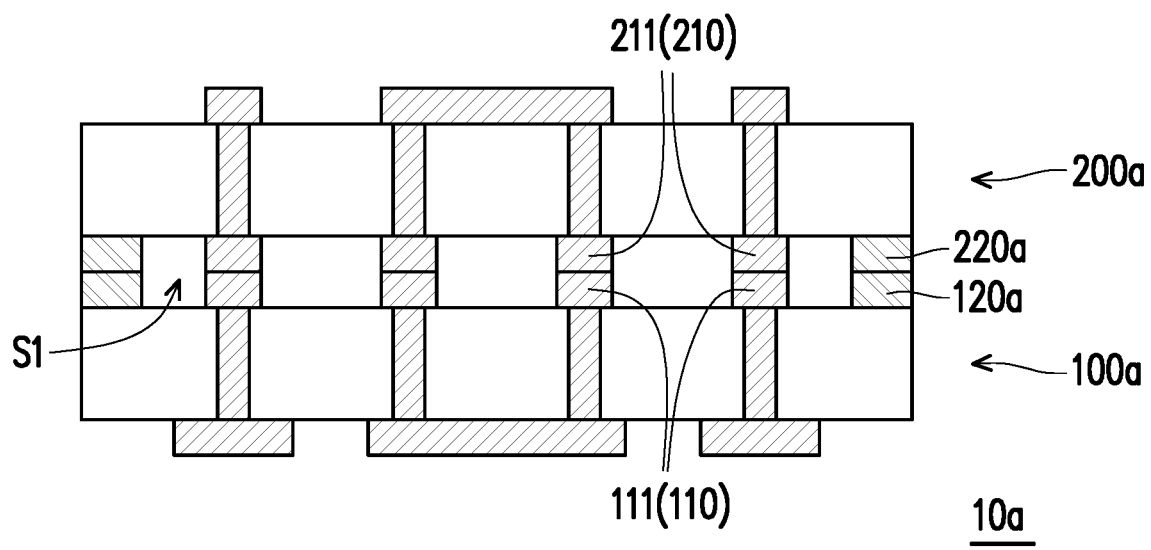
Figure 1C:
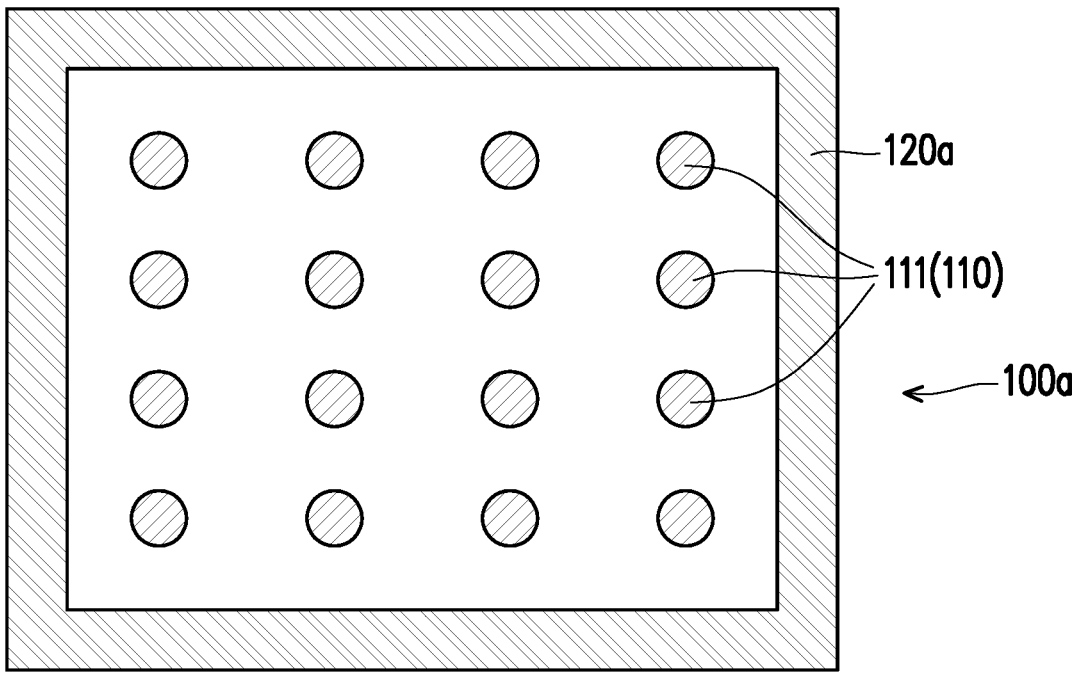
FIG. 1C is a top view of a first multilayer circuit board of FIG. 1A.
Figure 1D:
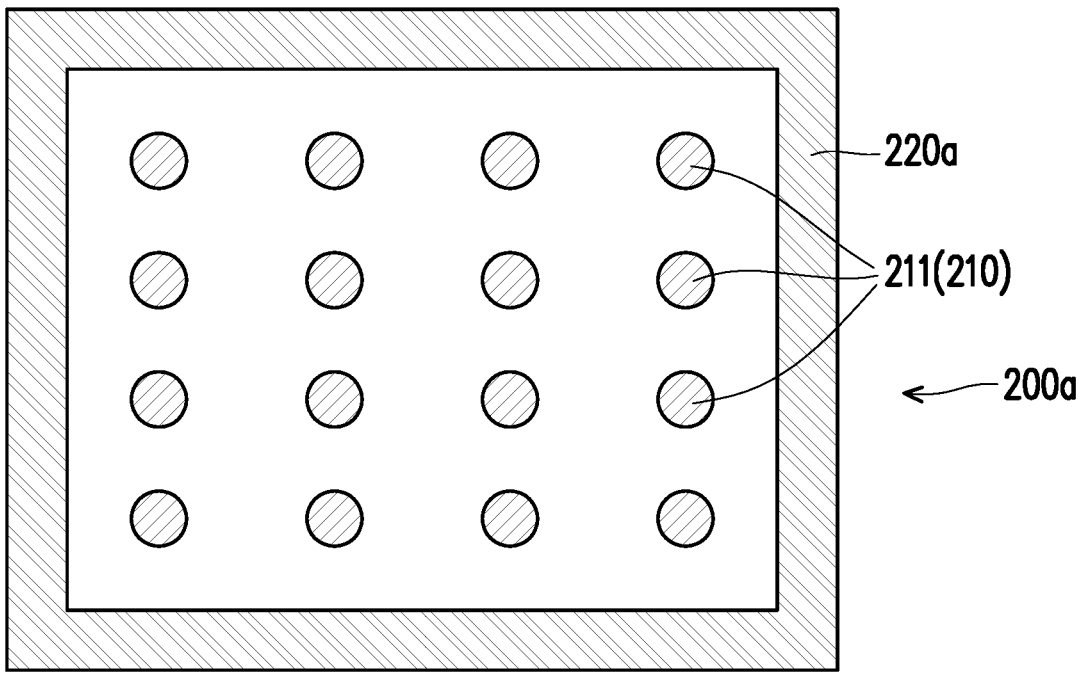
FIG. 1D is a bottom view of a second multilayer circuit board of FIG. 1A.

FIG. 1A and FIG. 1B are cross sectional views for illustrating a manufacturing method of multilayer circuit board structure according to an embodiment of the invention. FIG. 1C is a top view of a first multilayer circuit board of FIG. 1A. FIG. 1D is a bottom view of a second multilayer circuit board of FIG. 1A.

The manufacturing method of multilayer circuit board structure of the present embodiment includes the following steps. First of all, with reference to FIG. 1A, a first multilayer circuit board 100a and a second multilayer circuit board 200a are provided. In detail, the first multilayer circuit board 100a of this embodiment includes a first patterned circuit layer 110 and a first dummy circuit layer 120a, wherein the first dummy circuit layer 120a surrounds the first patterned circuit layer 110. Here, the first patterned circuit layer 110 is composed of a plurality of first pads 111 separated from each other. As shown by FIG. 1C, a shape of the first pad 111 is a circle in the top view, but not limited thereto. The first dummy circuit layer 120a is a continuous ring dummy circuit layer in the top view. The first patterned circuit layer 110 and the first dummy circuit layer 120a are made of the same material, such as copper, but not limited thereto.

Further, the second multilayer circuit board 200a of this embodiment includes a second patterned circuit layer 210 and a second dummy circuit layer 220a, wherein the second dummy circuit layer 220a surrounds the second patterned circuit layer 210. Here, the second patterned circuit layer 210 is composed of a plurality of second pads 211 separated from each other. As shown by FIG. 1D, a shape of the second pad 211 is a circle in the bottom view, but not limited thereto. The second dummy circuit layer 220a is a continuous ring dummy circuit layer in the bottom view. The second patterned circuit layer 210 and the second dummy circuit layer 220a are made of the same material, such as copper, but not limited thereto.

Then, with reference to FIG. 1B, a thermal compression process is performed to bond the first patterned circuit layer 110 to the second patterned circuit layer 210 and bond the first dummy circuit layer 120a to the second dummy circuit layer 220a such that a hollow space S1 is defined between the first multilayer circuit board 100a and the second multilayer circuit board 200a. Here, since the thermal compression process is performed in a vacuum environment, the hollow space is embodied as a vacuum space, and a dielectric constant of the hollow space is equal to 1. Accordingly, the metal-to-metal bonding is completed as the first patterned circuit layer 110 is bonded to the second patterned circuit layer 210 and the first dummy circuit layer 120a is bonded to the second dummy circuit layer 220a. On the other hand, the hollow space between the first multilayer circuit board 100a and the second multilayer circuit board 200a indicates that the dielectric-to-dielectric bonding is completed. Therefore, at this point, the manufacturing of a multilayer circuit board structure 10a is completed, and the hybrid bonding is achieved.

Structurally, referring to FIG. 1B again, the multilayer circuit board structure 10a of this embodiment includes the first multilayer circuit board 100a and the second multilayer circuit board 200a disposed on the first multilayer circuit board 100a. The first multilayer circuit board 100a includes the first patterned circuit layer 110 and the first dummy circuit layer 120a, wherein the first dummy circuit layer 120a surrounds the first patterned circuit layer 110. The second multilayer circuit board 200a includes the second patterned circuit layer 210 and the second dummy circuit layer 220a, wherein the second dummy circuit layer 220a surrounds the second patterned circuit layer 210. The first patterned circuit layer 110 is bonded to the second patterned circuit layer 210 and the first dummy circuit layer 120a is bonded to the second dummy circuit layer 220a. In particular, the hollow space S1 is defined between the first multilayer circuit board 100a and the second multilayer circuit board 200a.

In brief, in the multilayer circuit board structure 10a of this embodiment, the vacuum hollow space S1 is defined between the first multilayer circuit board 100a and the second multilayer circuit board 200a bonded to each other. In this way, in addition to achieving the hybrid bonding, the vacuum hollow space S1 may be used to replace the conventional macromolecular dielectric layer with the dielectric constant being approximately 3. Accordingly, the adhesion of the macromolecular dielectric layer may be avoided so the macromolecular 10a of this embodiment can have more referable yield and structural reliability.

It should be noted that the reference numerals and a part of the contents in the previous embodiment are used in the following embodiments, in which identical reference numerals indicate identical or similar components, and repeated description of the same technical contents is omitted. The omitted part of the description can refer to the foregoing embodiment, which is not repeated in the following embodiments.

Figure 2A:
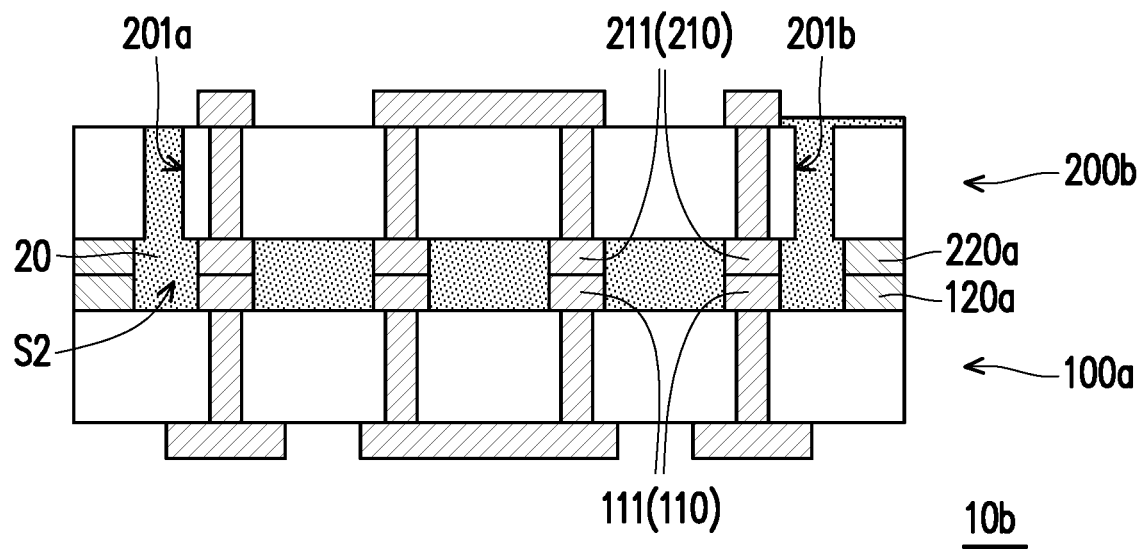
FIG. 2A is a cross sectional view of a multilayer circuit board structure according to an embodiment of the invention.
Figure 2B:
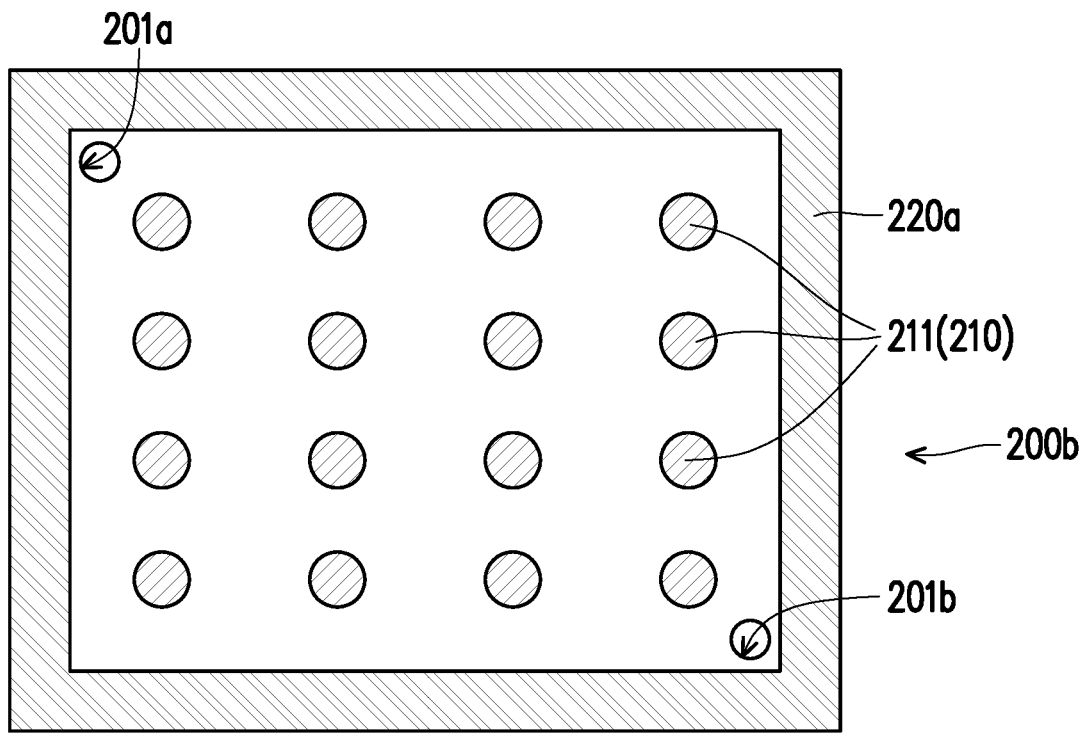
FIG. 2B is a bottom view of a second multilayer circuit board of FIG. 2A.

FIG. 2A is a cross sectional view of a multilayer circuit board structure according to an embodiment of the invention. FIG. 2B is a bottom view of a second multilayer circuit board of FIG. 2A. Referring to FIG. 1B, and FIGS. 2A and 2B together, a multilayer circuit board structure 10b of this embodiment is similar to the multilayer circuit board structure 10a of FIG. 1B, and the difference therebetween is that a second multilayer circuit board 200b of this embodiment has two through holes 201a and 201b, and the through holes 201a and 201b communicate through a hollow space S2. Here, one of the through holes 201a and 201b is an injection outlet, and another one of the through holes 201a and 201b is a gas outlet.

Further, the multilayer circuit board structure 10b of this embodiment further includes a dielectric material 20, wherein the dielectric material 20 is filled in the through holes 201a and 201b and the hollow space S2. Here, the dielectric material 20 may be injected from the through hole 201a to the hollow space S2 in a vacuum environment to be filled in the hollow space S2 and the through holes 201a and 201b. In particular, the dielectric material 20 of this embodiment may be selected according to the required dielectric constant, which is not limited herein. In addition, although the second multilayer circuit board 200b having the through holes 201a and 201b is used as an example herein, in other not illustrated embodiments, it is also possible that the first multilayer circuit board has the through holes and still falls within the scope of the invention.

In terms of manufacturing process, after the steps in FIG. 1B (i.e., after the thermal compression process is performed), with reference to FIG. 2A, the hollow space S2 is defined between the first multilayer circuit board 100a and the second multilayer circuit board 200b. At this point, the through holes 201a and 201b of the second multilayer circuit board 200b communicate through the hollow space S2. Next, the dielectric material 20 is provided such that the dielectric material 20 is filled in the through holes 201a and 201b and the hollow space S2 in the vacuum environment. Here, a material of the dielectric material 20 is, for example, an epoxy resin or other suitable materials, but not particularly limited herein. At this point, the manufacturing of the multilayer circuit board structure 10b is completed.

In brief, after the thermal compression process is performed on the first multilayer circuit board 100a and the second multilayer circuit board 200b of the multilayer circuit board structure 10b of this embodiment, the dielectric material 20 with the required dielectric constant is selected to fill in the through holes 201a and 201b and the hollow space S2 in the vacuum space. In this way, in addition to achieving the hybrid bonding, the dielectric material 20 with the required dielectric constant may also be selected according to product requirements so the multilayer circuit board structure 10b can have more preferable yield rate and product design freedom.

Figure 3A:
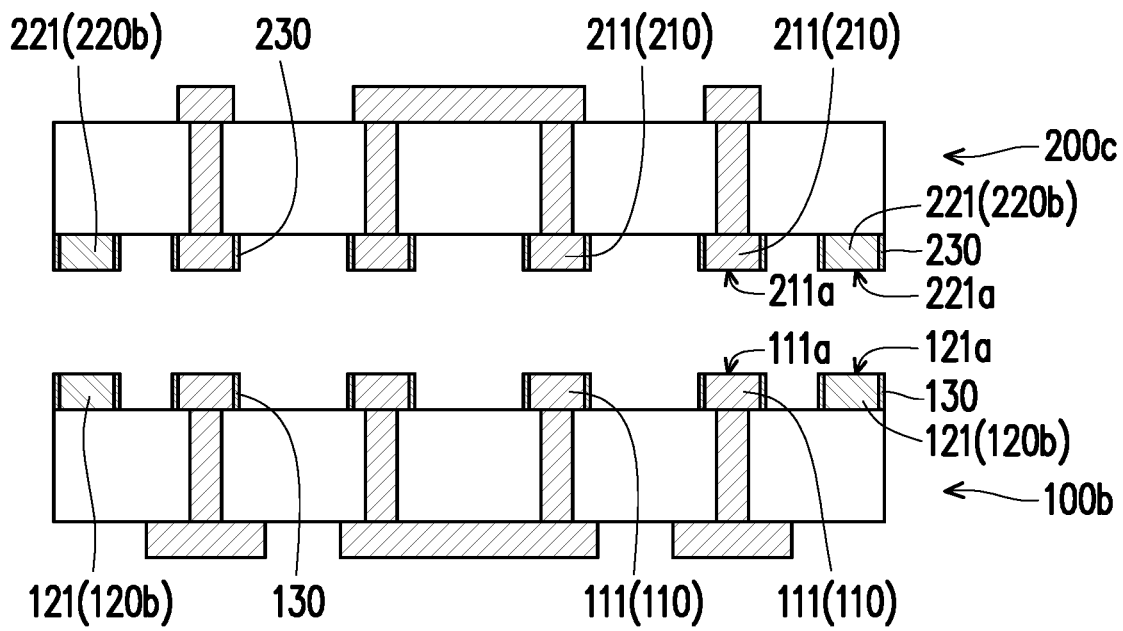
FIG. 3A and FIG. 3B are cross sectional views for illustrating a manufacturing method of multilayer circuit board structure according to another embodiment of the invention.
Figure 3B:
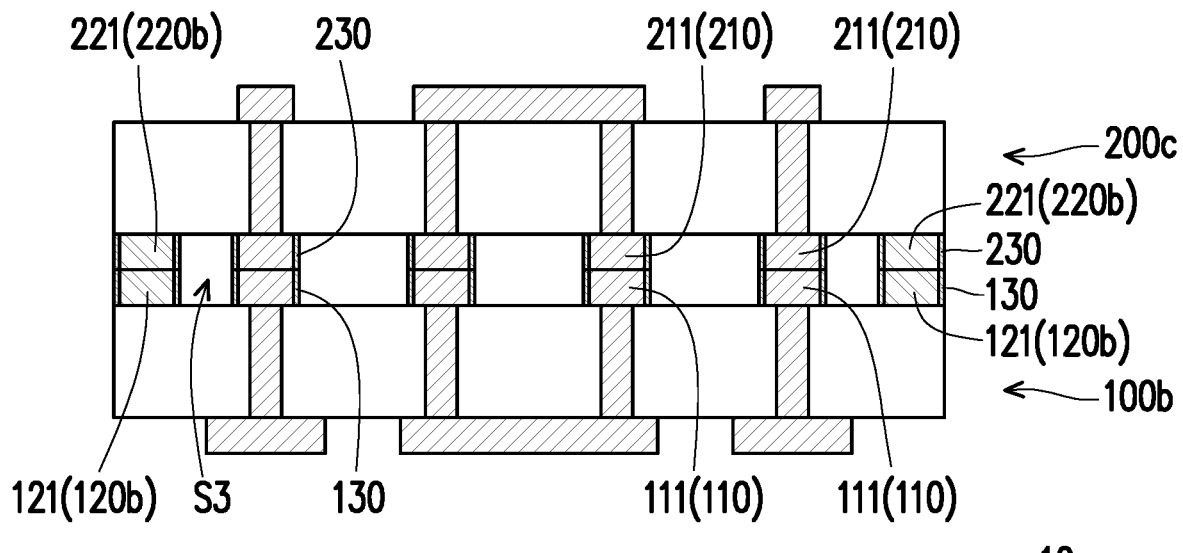
Figure 3C:
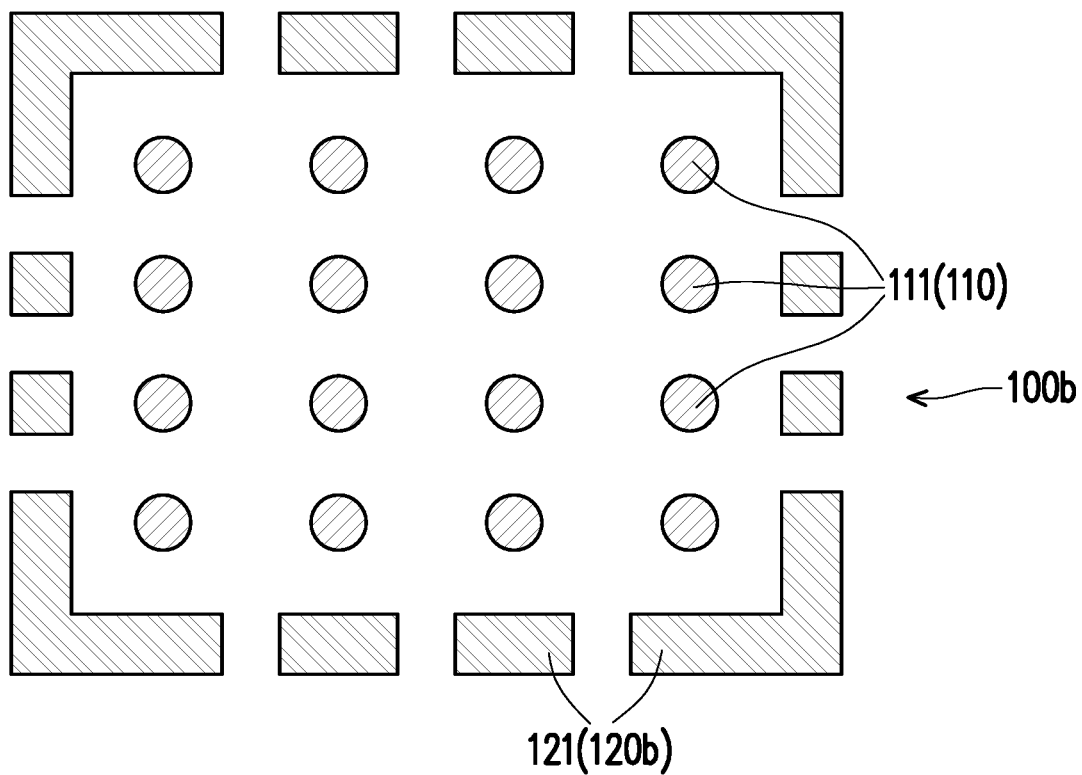
FIG. 3C is a top view of a first multilayer circuit board of FIG. 3A.
Figure 3D:
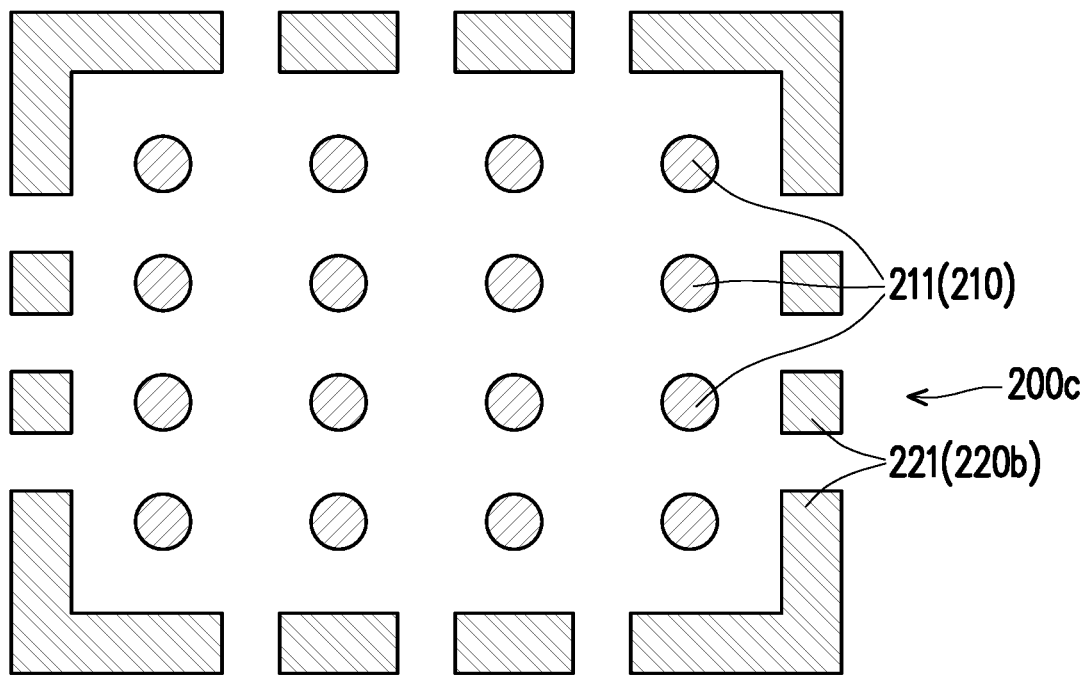
FIG. 3D is a bottom view of a second multilayer circuit board of FIG. 3A.

FIG. 3A and FIG. 3B are cross sectional views for illustrating a manufacturing method of multilayer circuit board structure according to another embodiment of the invention. FIG. 3C is a top view of a first multilayer circuit board of FIG. 3A. FIG. 3D is a bottom view of a second multilayer circuit board of FIG. 3A. For illustrative purposes, certain components, such as a first surface treatment layer 130 and a second surface treatment layer 230 are omitted in FIG. 3C and FIG. 3D.

Referring to FIG. 1B, FIG. 1C, FIG. 1D, FIG. 3B, FIG. 3C and FIG. 3D together, a multilayer circuit board structure 10c of this embodiment is similar to the multilayer circuit board structure 10a of FIG. 1B, and the difference therebetween is that each of a first dummy circuit layer 120b of a first multilayer circuit board 100b and a second dummy circuit layer 220b of a second multilayer circuit board 200c is a discontinuous ring dummy circuit layer. More specifically, the first dummy circuit layer 120b is a discontinuous ring dummy circuit layer in the top view, and the second dummy circuit layer 220b is a discontinuous ring dummy circuit layer in the bottom view. The first dummy circuit layer 120b includes a plurality of first dummy pads 121, and the second dummy circuit layer 220b includes a plurality of second dummy pads 221. Here, a hollow space S3 is an air space with the dielectric constant being approximately 1.

In order to prevent the first patterned circuit layer 110 and the second patterned circuit layer 210 from oxidation in an air environment, referring to FIG. 3A and FIG. 3B together, the multilayer circuit board structure 10c further includes the first surface treatment layer 130 and the second surface treatment layer 230. The first surface treatment layer 130 is disposed around the first pads 111 and around the first dummy pads 121. At this point, the first surface treatment layer 130 exposes a first contact surface 111a of each of the first pads 111 and a first dummy contact surface 121a of each of the first dummy pads 121. The second surface treatment layer 230 is disposed around the second pads 211 and around the second dummy pads 221. At this point, the second surface treatment layer 230 exposes a second contact surface 211a of each of the second pads 211 and a second dummy contact surface 221a of each of the second dummy pads 221. The first contact surface 111a of each of the first pads 111 is bonded to the corresponding second contact surface 211a of each of the second pads 211. The first dummy contact surface 121a of each of the first dummy pads 121 is bonded to the corresponding second dummy contact surface 221a of each of the second dummy pads 221. The first surface treatment layer 130 is bonded to the second surface treatment layer 230. Here, materials of the first surface treatment layer 130 and the second surface treatment layer 230 is, for example, electroless nickel immersion gold, electroless nickel/electroless palladium/immersion gold, Ti or other metals or alloys, which are not particularly limited herein.

In terms of manufacturing process, with reference to FIG. 3A, the first surface treatment layer 130 and the second surface treatment layer 230 are formed before the thermal compression process of FIG. 1B is performed. The first surface treatment layer 130 is disposed around the first pads 111 and around the first dummy pads 121. At this point, the first surface treatment layer exposes the first contact surfaces 111a of the first pads 111 and the first dummy contact surfaces 121a of the first dummy pads 121. The second surface treatment layer 230 is disposed around the second pads 211 and around the second dummy pads 221. The second surface treatment layer 230 exposes the second contact surfaces 211a of the second pads 211 and the second dummy contact surfaces 221a of the second dummy pads 221.

Next, with reference to FIG. 3B, the thermal compression process is performed in the air environment such that the first contact surfaces 111a of the first pads 111 are bonded to the corresponding second contact surfaces 211a of the second pads 211. At this point, the first dummy contact surfaces 121a of the first dummy pads 121 are also bonded to the corresponding second dummy contact surfaces 221a of the second dummy pads 221. In addition, the first surface treatment layer 130 is also bonded to the second surface treatment layer 230. Accordingly, the metal-to-metal bonding is completed as the first patterned circuit layer 110 is bonded to the second patterned circuit layer 210 and the first dummy circuit layer 120b is bonded to the second dummy circuit layer 220b. On the other hand, the hollow space S3 (i.e., the air space) between the first multilayer circuit board 100b and the second multilayer circuit board 200c indicates that the dielectric-to-dielectric bonding is completed. Therefore, at this point, the manufacturing of the multilayer circuit board structure 10c is completed, and the hybrid bonding is achieved.

Figure 4A:
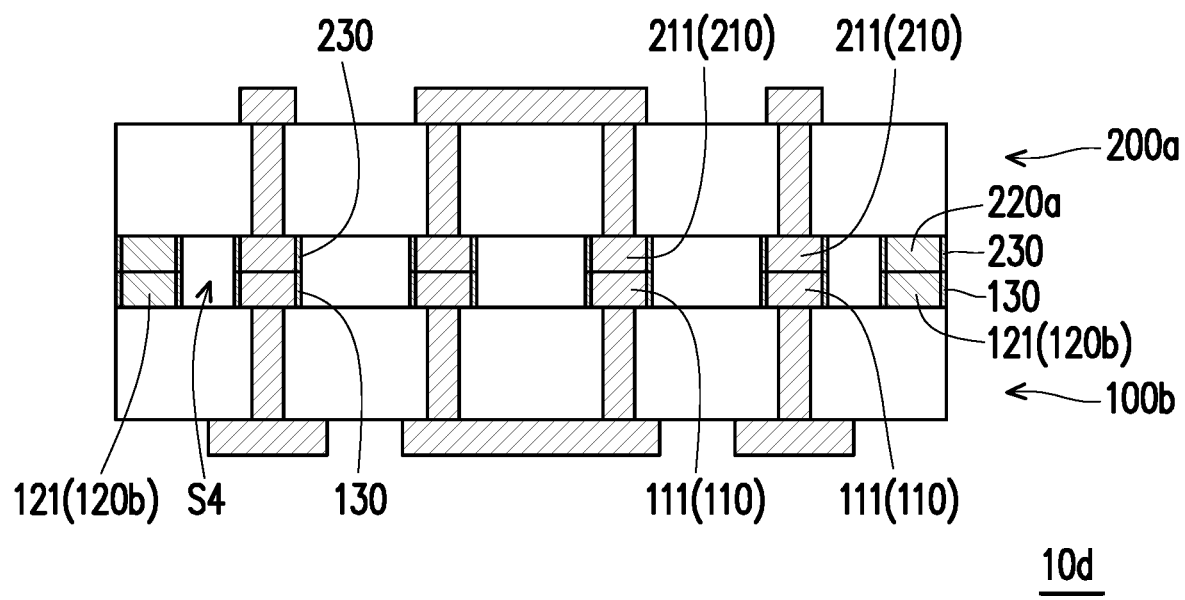
FIG. 4A is a cross sectional view of a multilayer circuit board structure according to another embodiment of the invention.
Figure 4B:
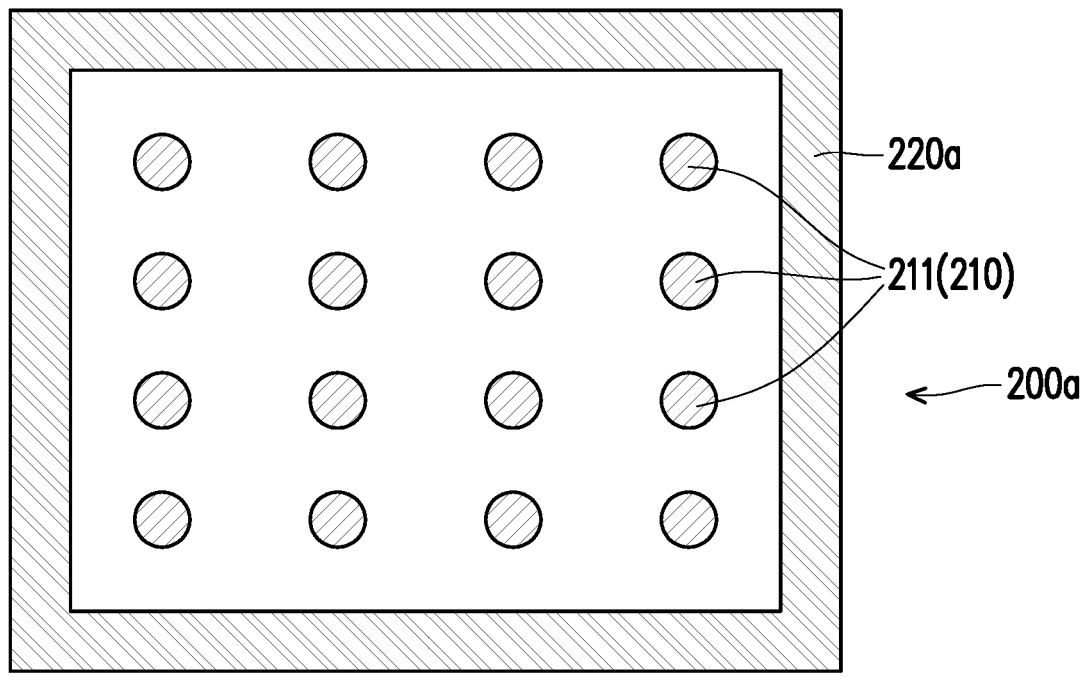
FIG. 4B is a bottom view of a second multilayer circuit board of FIG. 4A.

FIG. 4A is a cross sectional view of a multilayer circuit board structure according to another embodiment of the invention. FIG. 4B is a bottom view of a second multilayer circuit board of FIG. 4A. For illustrative purposes, certain components, such as the second surface treatment layer 230 is omitted in FIG. 4B. Referring to FIG. 3B, FIG. 3D, FIG. 4A and FIG. 4B together, a multilayer circuit board structure 10d of this embodiment is similar to the multilayer circuit board structure 10c of FIG. 3B, and the difference therebetween is that the second dummy circuit layer 220a of the second multilayer circuit board 200a of this embodiment is a continuous ring dummy circuit layer in the bottom view, and a hollow space S4 between the first multilayer circuit board 100b and the second multilayer circuit board 200a is an air space. Naturally, in other not illustrated embodiments, it is also possible that the first dummy circuit layer of the first multilayer circuit board is a continuous ring dummy circuit layer in the top view, the second dummy circuit layer of the second multilayer circuit board is a discontinuous ring dummy circuit layer in the bottom view, and the hollow space is the air space (which still fall within the scope of the invention).

It is worth noting that, although the foregoing embodiments are described by using two multilayer circuit boards as an example, in other not illustrated embodiments, it is also possible that two or more multilayer circuit boards may be bonded by ways of the hybrid bonding (which still fall within the scope of the invention).

In summary, in the design of the multilayer circuit board structure of the invention, with the hollow space defined between the first multilayer circuit board and the second multilayer circuit board bonded to each other, in addition to achieving the hybrid bonding, the dielectric constant of the hollow space may also be selected according to product requirements to provide more preferable yield rate and product design freedom.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A multilayer circuit board structure, comprising:
a first multilayer circuit board, comprising a first patterned circuit layer and a first dummy circuit layer surrounding the first patterned circuit layer; and
a second multilayer circuit board, disposed on the first multilayer circuit board, and comprising a second patterned circuit layer and a second dummy circuit layer surrounding the second patterned circuit layer, wherein the first patterned circuit layer is bonded to the second patterned circuit layer and the first dummy circuit layer is bonded to the second dummy circuit layer such that a hollow space is defined between the first multilayer circuit board and the second multilayer circuit board.
2. The multilayer circuit board structure according to claim 1, wherein each of the first dummy circuit layer and the second dummy circuit layer is a continuous ring dummy circuit layer.
3. The multilayer circuit board structure according to claim 2, wherein the hollow space is a vacuum space.

4. The multilayer circuit board structure according to claim 3, further comprising:
a dielectric material, one of the first multilayer circuit board and the second multilayer circuit board having two through holes, the through holes communicating through the hollow space, and the dielectric material being filled in the through holes and the hollow space.

5. The multilayer circuit board structure according to claim 1, wherein each of the first dummy circuit layer and the second dummy circuit layer is a discontinuous ring dummy circuit layer, and the hollow space is an air space.

6. The multilayer circuit board structure according to claim 5, further comprising:
a first surface treatment layer, the first patterned circuit layer having a plurality of first pads, the first dummy circuit layer having a plurality of first dummy pads, the first surface treatment layer being disposed around the first pads and around the first dummy pads, and the first surface treatment layer exposing a first contact surface of each of the first pads and a first dummy contact surface of each of the first dummy pads; and
a second surface treatment layer, the second patterned circuit layer having a plurality of second pads, the second dummy circuit layer having a plurality of second dummy pads, the second surface treatment layer being disposed around the second pads and around the second dummy pads, the second surface treatment layer exposing a second contact surface of each of the second pads and a second dummy contact surface of each of the second dummy pads, the first contact surface of each of the first pads is bonded to the corresponding second contact surface of each of the second pads, the first dummy contact surface of each of the first dummy pads is bonded to the corresponding second dummy contact surface of each of the second dummy pads, and the first surface treatment layer is bonded to the second surface treatment layer.

7. The multilayer circuit board structure according to claim 1, wherein one of the first dummy circuit layer and the second dummy circuit layer is a continuous ring dummy circuit layer, another one of the first dummy circuit layer and the second dummy circuit layer is a discontinuous ring dummy circuit layer, and the hollow space is an air space.

8. A manufacturing method of multilayer circuit board structure, comprising:
providing a first multilayer circuit board and a second multilayer circuit board, the first multilayer circuit board comprising a first patterned circuit layer and a first dummy circuit layer surrounding the first patterned circuit layer, and the second multilayer circuit board comprising a second patterned circuit layer and a second dummy circuit layer surrounding the second patterned circuit layer; and
performing a thermal compression process to bond the first patterned circuit layer to the second patterned circuit layer and bond the first dummy circuit layer to the second dummy circuit layer such that a hollow space is defined between the first multilayer circuit board and the second multilayer circuit board.

9. The manufacturing method of multilayer circuit board structure according to claim 8, wherein each of the first dummy circuit layer and the second dummy circuit layer is a continuous ring dummy circuit layer.

10. The manufacturing method of multilayer circuit board structure according to claim 9, wherein the thermal compression process is performed in a vacuum environment, and the hollow space is a vacuum space.

11. The manufacturing method of multilayer circuit board structure according to claim 10, wherein after the thermal compression process is performed, the manufacturing method further comprises:
providing a dielectric material, one of the first multilayer circuit board and the second multilayer circuit board having two through holes, the through holes communicating through the hollow space, and the dielectric material being filled in the through holes and the hollow space.

12. The manufacturing method of multilayer circuit board structure according to claim 8, wherein each of the first dummy circuit layer and the second dummy circuit layer is a discontinuous ring dummy circuit layer, and the hollow space is an air space.

13. The manufacturing method of multilayer circuit board structure according to claim 12, wherein before the thermal compression process is performed, the manufacturing method further comprises:
forming a first surface treatment layer, the first patterned circuit layer having a plurality of first pads, the first dummy circuit layer having a plurality of first dummy pads, the first surface treatment layer being disposed around the first pads and around the first dummy pads, and the first surface treatment layer exposing a first contact surface of each of the first pads and a first dummy contact surface of each of the first dummy pads; and
forming a second surface treatment layer, the second patterned circuit layer having a plurality of second pads, the second dummy circuit layer having a plurality of second dummy pads, the second surface treatment layer being disposed around the second pads and around the second dummy pads, and the second surface treatment layer exposing a second contact surface of each of the second pads and a second dummy contact surface of each of the second dummy pads,
wherein during the thermal compression process, the first contact surface of each of the first pads is bonded to the corresponding second contact surface of each of the second pads, the first dummy contact surface of each of the first dummy pads is bonded to the corresponding second dummy contact surface of each of the second dummy pads, and the first surface treatment layer is bonded to the second surface treatment layer.

14. The manufacturing method of multilayer circuit board structure according to claim 8, wherein one of the first dummy circuit layer and the second dummy circuit layer is a continuous ring dummy circuit layer, another one of the first dummy circuit layer and the second dummy circuit layer is a discontinuous ring dummy circuit layer, and the hollow space is an air space.

* * * * *